United States Patent [19]
Zambrano

[11] Patent Number: 5,591,662
[45] Date of Patent: Jan. 7, 1997

[54] METHOD OF MANUFACTURING A POWER INTEGRATED CIRCUIT (PIC) STRUCTURE

[75] Inventor: Raffaele Zambrano, San Giovanni La Punta, Italy

[73] Assignee: Consorizio Per La Ricerca Sulla Microelecttronica Nel Mezzogiorna, Catania, Italy

[21] Appl. No.: 471,902

[22] Filed: Jun. 7, 1995

Related U.S. Application Data

[62] Division of Ser. No. 443,053, May 17, 1995.

[30] Foreign Application Priority Data

May 19, 1994 [EP] European Pat. Off. ............... 9483029

[51] Int. Cl.[6] ...................................................... H01L 21/70
[52] U.S. Cl. ................................ 437/57; 437/34; 437/59; 437/75
[58] Field of Search .................................. 437/57, 59, 51, 437/54, 911, 154, 70, 34, 40 DM, 41 DM, 74, 75

[56] References Cited

U.S. PATENT DOCUMENTS

| Re. 34,025 | 8/1992 | Takagi et al. | 357/43 |
|---|---|---|---|
| 4,001,860 | 1/1977 | Cauge et al. | 357/23 |
| 4,072,975 | 2/1978 | Ishitani | 357/23 |
| 4,233,615 | 11/1980 | Takemoto et al. | 357/22 |
| 4,344,081 | 8/1982 | Pao et al. | 357/43 |
| 4,814,288 | 3/1989 | Kimura et al. | 437/59 |
| 5,156,989 | 10/1992 | Williams et al. | 437/57 |
| 5,246,871 | 9/1993 | Zambrano et al. | 437/59 |
| 5,340,756 | 8/1994 | Nagayasu | 437/57 |

FOREIGN PATENT DOCUMENTS

| 0239060 | 9/1987 | European Pat. Off. | H01L 27/06 |
|---|---|---|---|
| 0403016 | 12/1990 | European Pat. Off. | H01L 27/06 |

OTHER PUBLICATIONS

European Search Report from European Patent Application No. 94830229.4, filed May 19, 1994.
Patent Abstracts of Japan, vol. 13, No. 481 (E–563) (2823) Dec. 8, 1987 & JP–A–62 143 450 Hitachi Ltd.
Patent Abstracts of Japan, vol. 13, No. 481 (E–838) (3829) Oct. 31, 1989 & JP–A–01 189 155 Sharp Corporation.
"A Very High Voltage Technology (up to 1200V) for Vertical Smart Power icS", Jacques P. Mille, Smart power R&D, SGS–Thomson Microelectronics, BP2–13106 Rousset, France, pp. 517–525.
"Adding 4 Mask Steps to a Power–Mosfet Process Reaps a Unique Suite of Control Devices", Technology Advances, Mar. 4, 1993.
"A Scaled CMOS–Compatible Smart Power IC Technology", S. L. Wong et al., Philips Laboratories, Briarcliff Manor, N.Y., pp. 51–55.
"Medium–Voltage Switching Devices Compatible with Standard CMOS Technology", F. H. Bohrens et al., Epe Figenze, 1991, pp. 0–098 –0–103.

*Primary Examiner*—Tuan H. Nguyen
*Attorney, Agent, or Firm*—David M. Driscoll; James H. Morris; John N. Anastasi

[57] ABSTRACT

A PIC structure comprises a lightly doped semiconductor layer of a first conductivity type, superimposed over a heavily doped semiconductor substrate of the first conductivity type, wherein a power stage and a driving and control circuitry including first conductivity type-channel MOSFETs and second conductivity type-channel MOSFETs are integrated; the first conductivity type-channel and the second conductivity type-channel MOSFETs are provided inside second conductivity type and first conductivity type well regions, respectively, which are included in at least one isolated lightly doped region of the first conductivity type completely surrounded and isolated from the lightly doped layer of the first conductivity type by means of a respective isolation region of a second conductivity type.

14 Claims, 5 Drawing Sheets

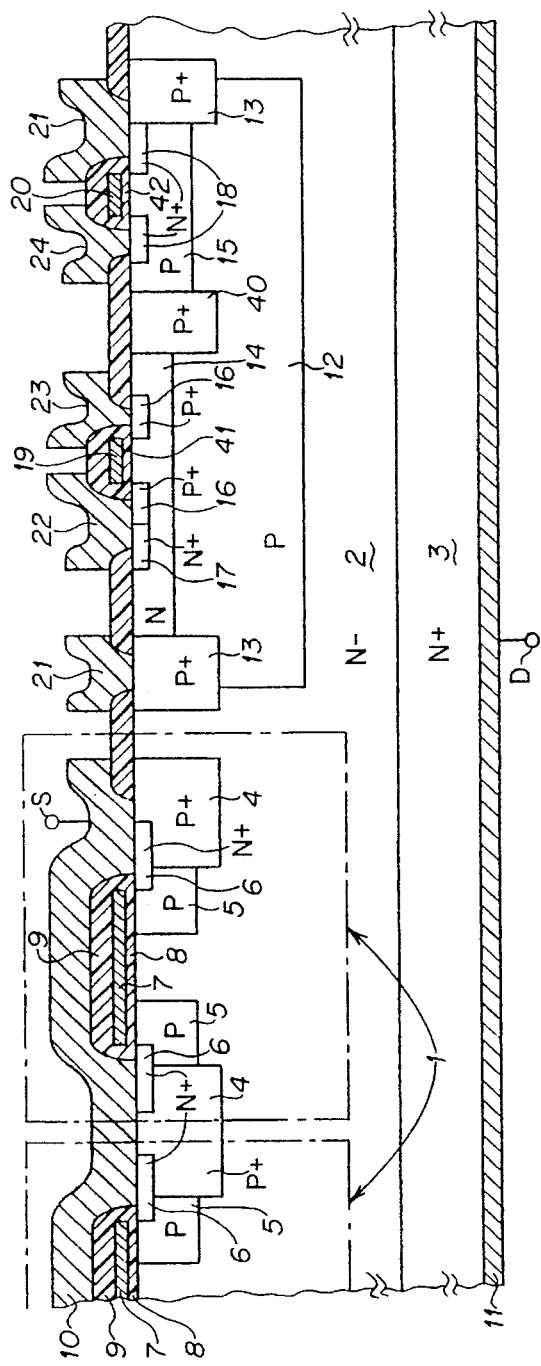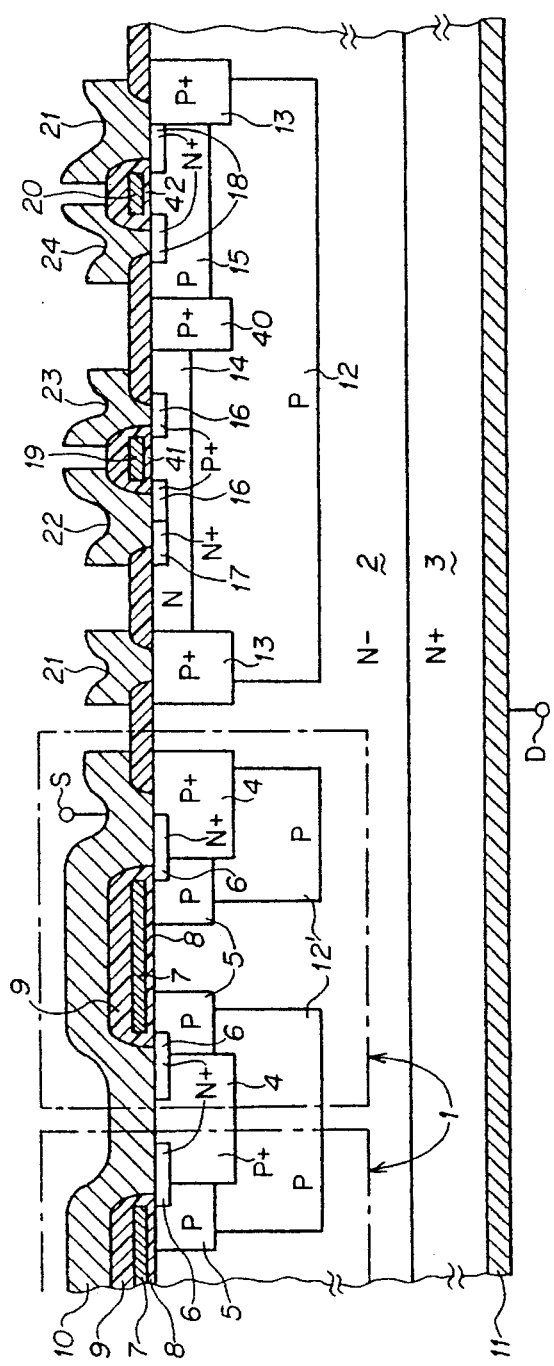

METHOD OF MANUFACTURING A POWER INTEGRATED CIRCUIT (PIC) STRUCTURE

This application is a division of application Ser. No. 08/443,053, filed May 17, 1995, entitled POWER INTEGRATED CIRCUIT ("PIC") STRUCTURE, AND MANUFACTURING PROCESS THEREOF, now pending.

BACKGROUND OF THE INVENTION

1. Field of the Invention

The present invention relates to a Power Integrated Circuit ("PIC") structure, and to a manufacturing process thereof.

2. Discussion of the Related Art

The name "Power Integrated Circuit" ("PIC") refers to a monolithic integrated structure comprising a power stage and a driving, control and protection circuit.

Several efforts have been made to obtain PICs with a minimum increase in the fabrication process complexity. Examples are given in the documents listed below, each of which is incorporated herein by reference:

1) J. P. Mille, Proceedings of Symposium on HV & Smart Power ICs, Los Angeles, May 1989, pages 517–525;

2) F. Goodenough, Electronic Design, Mar. 4, 1993, pages 27–28;

3) S. L. Wong, M. J. Kim, J. C. Young and S. Mukherjee, Proceedings of 3rd ISPSD, Baltimore, April 1991, pages 51–55;

4) F. H. Beherens, G. Charitat and P. Rossel, Proceedings of Symposium on Materials and Devices for Power Electronics, Florence, September 1991, pages 98–103.

In references 1) and 2) manufacturing processes are described for providing PICs with a Vertical Double-diffused power MOSFET ("VDMOSFET") and/or a power NPN bipolar junction transistor power stage, where the driving and control circuitry comprises N-channel MOSFETs (both enhancement and depletion mode); the N-channel MOSFETs of the driving and control circuitry are provided in a P type well diffused in the lightly doped N type epitaxial layer constituting, together with a heavily doped N+ silicon substrate, the VDMOSFET drain; the electric isolation of the driving and control circuitry from the power stage is achieved by reverse biasing the P type well/N type epitaxial layer junction (this technique is known as self-isolation).

With respect to the VDMOSFET manufacturing process, these processes only require the addition of a few steps, such as the definition of the P type well and of the depletion implant. A major drawback resides in that it is difficult to implement complex logic and analog functions with just N-channel MOSFETs.

References 3) and 4) describe how a conventional P-well CMOS process can be adapted to integrate a VDMOS-based PIC. The driving and control circuitry comprises both N-channel and P-channel MOSFETs, the N-channel MOSFETs being integrated inside a P type well diffused into a lightly doped N type epitaxial layer, grown over a heavily doped N+ substrate; the P-channel MOSFETs on the other hand are directly fabricated in the N type epitaxial layer, which also forms, together with the N+ substrate, the drain of the VDMOSFET.

Since the channel region of the P-channel MOSFETs coincides with the VDMOSFET drain, such a device cannot be used as a Low Side Driver ("LSD") (with the load connected between the power supply and the VDMOSFET switch): in this circuit configuration, in fact, the VDMOSFET drain potential varies from a few tenths of Volts up to the voltage supply (VCC). If the device is used as a High Side Driver ("HSD") (with the load connected between the VDMOSFET source and ground), the VDMOSFET drain is connected to the voltage supply: the P-channel MOSFETs must therefore have the source electrode connected to VCC.

In view of the state of the art just described, an object of the present invention is the integration of a PIC structure with driving and control circuitry comprising both N-channel and P-channel MOSFETs, that overcomes at least the above mentioned drawbacks.

SUMMARY OF THE INVENTION

According to the present invention, this object and others are attained by means of a PIC structure comprising a lightly doped semiconductor layer of a first conductivity type superimposed over a heavily doped semiconductor substrate of the first conductivity type, wherein a power stage and a driving and control circuit comprising first conductivity type-channel MOSFETs and second conductivity type-channel MOSFETs are integrated, wherein the first conductivity type-channel and the second conductivity type-channel MOSFETs are provided inside second conductivity type and first conductivity type well regions, respectively, which are included in at least one isolated lightly doped region of the first conductivity type completely surrounded and isolated from the lightly doped layer of the first conductivity type by means of a respective isolation region of a second conductivity type.

As a result of the present invention, it is possible to obtain a PIC structure with a driving and control circuit comprising both N-channel and P-channel MOSFETs isolated from the power stage. The power stage can comprise a Vertical Double-diffused MOSFET (VDMOSFET), or a vertical bipolar junction transistor, or both.

BRIEF DESCRIPTION OF THE DRAWINGS

These and other features of the present invention will be made more evident by the following detailed description of some particular embodiments, illustrated as non-limiting examples in the annexed drawings, wherein:

FIG. 1 is a cross-sectional view of a PIC structure according to a first embodiment of the present invention;

FIG. 1A is a cross-sectional view of a variation of the PIC structure of FIG. 1;

DETAILED DESCRIPTION

Figure 2:
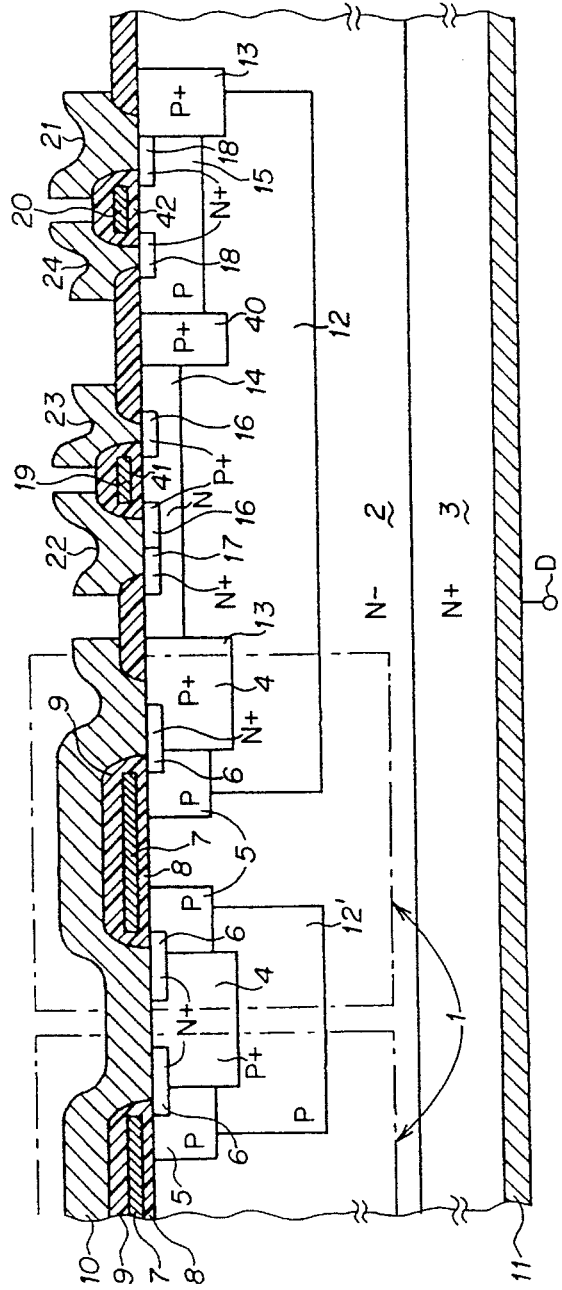
FIG. 2 is a cross-sectional view of a PIC structure according to a second embodiment of the present invention.

In a first embodiment, a PIC structure according to the present invention comprises, in a first chip region, a Vertical Double-diffused power MOSFET ("VDMOSFET") power stage made up in a per-se known way of a bidimensional array of elementary cells 1 provided in a lightly doped N type epitaxial layer 2, grown on a heavily doped N type substrate 3.

Each elementary cell 1 comprises in a per-se known way heavily doped P type deep body regions 4, lightly doped P type body regions 5 and heavily doped N type source regions 6; a polysilicon gate 7, insulated from the top surface of the lightly doped N type layer 2 by a thin gate oxide layer 8, is superimposed over the lightly doped P type body regions 5, which therefore act as channel regions when a proper bias voltage is applied to the polysilicon gate 7. The polysilicon gate 7 is covered by an insulating layer 9. A metal layer 10 is superimposed over the insulating layer 9 and contacts the source regions 6 and the deep body regions 4 of all the elementary cells 1; the metal layer 10 forms a source electrode S of the VDMOSFET. A metal layer 11 is also provided at the bottom surface of the substrate 3 to form a drain electrode D of the VDMOSFET (FIG. 1).

A driving and control circuit is integrated in a second region of the PIC chip; in the example of FIG. 1, only an N-channel MOSFET and a P-channel MOSFET (both are enhancement-mode) are shown.

The N-channel and P-channel MOSFETs are fabricated inside a P type well 15 and an N type well 14, respectively. The P type well 15 and the N type well 14 are provided inside an isolated portion of the lightly doped N type layer 2 completely surrounded by a P type buried region 12, at the bottom, and, laterally, by a heavily doped P type annular region 13 which extends from the top surface of the N type layer 2 downwards, and contacts the P type buried region 12. The P type well 15 extends downwards to contact the P type buried region 12 and is separated from the N type well 14 by a heavily doped P type region 40 also in contact with the P type buried region 12.

The P type well 15 forms a channel region for the N-channel MOSFET; the N type well 14 forms a channel region for the P-channel MOSFET. The P type and N type wells 15 and 14 are provided inside said isolated portion of the N type layer 2, which has a low dopant concentration, their doping level can thus be adjusted to obtain the desired threshold voltages for the N-channel and P-channel MOSFETs. If the doping level of the N type layer 2 is considered adequate, the N type well 14 coincides with the isolated portion of the N type layer 2 not occupied by the P type well 15. An additional degree of freedom is introduced if the doping level of the N type well 14 is set independently from that of the N type layer 2, so that the electrical characteristics of the VDMOSFET and of the P-channel MOSFET can be independently optimized. As known to those skilled in the art, and as will be described in the following, this can be easily done by selectively introducing N type or P type dopants in the isolated portion of the N type layer 2, to obtain an N type well 14 with a surface concentration different from that of the N type layer 2.

Inside the N type well 14, heavily doped P type source and drain regions 16 for the P-channel MOSFET are provided, as well as a heavily doped N type contact region 17 for the N type well. Similarly, heavily doped N type source and drain regions 18 for the N-channel MOSFET are provided inside the P type well. Polysilicon gates 19 and 20, respectively insulated from the surface of the N type well 14 and of the P type well 15 by portions 41 and 42 of a thin gate oxide layer (which can coincide with the oxide layer 8), extend between the source and drain regions 16 and 18 of the P-channel and N-channel MOSFETs, respectively.

The heavily doped P type region 13 is contacted by a metallization 21, which is connected to the lowest potential, so that the junction between the lightly doped N type layer 2 and the P type regions 12, 13 and 40 is reverse biased in all operating conditions; this ensures that the driving and control circuitry is electrically isolated from the VDMOSFET. The metallization 21 also contacts the source region 18 of the N-channel MOSFET (in this embodiment the N-channel MOSFET has a grounded source, and this is the lowest potential present on the device). Metal interconnections 22–24 contact the P type source and drain regions 16 of the P-channel MOSFET, and the drain region 18 of the N-channel MOSFET; the region 17 is also contacted by the metallization 22, which short-circuits the P-channel MOSFET source 16 with the N type well region 14.

Incidentally, P type buried regions 12' can also be defined under the P+ deep body regions 4 of the elementary cells 1 (FIG. 1A), to reduce the gain of the parasitic NPN bipolar junction transistor associated with each of them and having emitter, base and collector respectively represented by the N+ source regions 6, the P body regions 5 and the P+ deep body regions 4, and the N type layer 2 and the N+ substrate 3. This results in a higher degree of ruggedness of the VDMOSFET and thus of the PIC device.

A second embodiment of the PIC structure according to the present invention, shown in FIG. 2, provides for increasing the compactness of the structure, especially in PICs where the power stage is designed to work as a Low Side Driver (LSD). In this case the source electrode S of the VDMOSFET is the circuit node at the lowest potential, and then the heavily doped P type region 13 should be connected to it. This can be done by merging the heavily doped P type region 13 with the P+ deep body region 4 of at least one elementary cell 1.

Figure 2A:
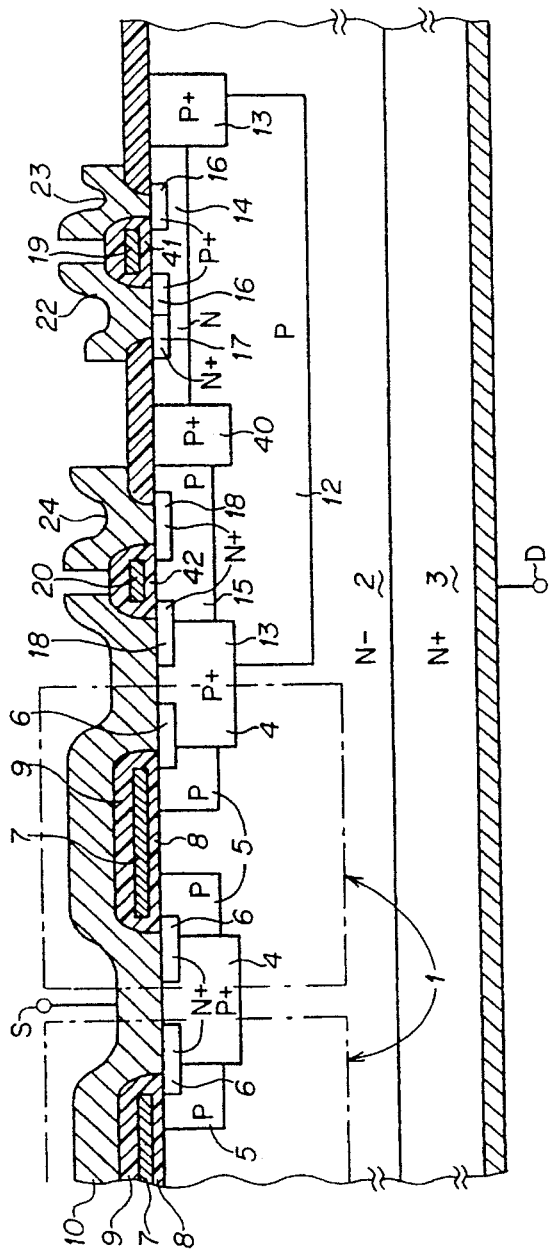
FIG. 2A is a cross-sectional view of a variation of the PIC structure of FIG. 2.

An even more compact structure can be obtained if the P type well 15 is adjacent to the portion of the region 13 merged to the P+ deep body region 4 of an elementary cell 1: the N-channel MOSFET source region 18 can in this case be directly contacted by the source electrode metallization 10 of the VDMOSFET (FIG. 2A).

The PIC structure according to any one of the embodiments of the present invention allows the integration of junction diodes electrically isolated from the power stage, a feature which is not contemplated in any one of the prior art PIC structures.

A manufacturing process suitable to provide the PIC structure shown in FIG. 1 starts with the epitaxial growth of a first lightly doped N type layer 2' over the heavily doped N type substrate 3.

Figure 3:
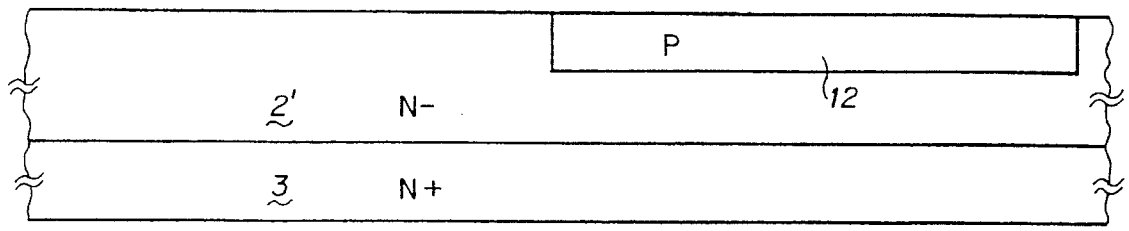
FIGS. 3 to 8 are cross-sectional views of the PIC structure of FIG. 1, showing intermediate steps of a manufacturing process according to the present invention.

A P type dopant is then selectively introduced into the lightly doped N type epitaxial layer 2' to form at least one P type buried region 12; a conventional technique provides for growing an oxide layer over the N type epitaxial layer 2', selectively removing the oxide layer from selected regions of the N type epitaxial layer 2' surface, and then implanting and diffusing a P type dopant. The remaining oxide layer is then completely removed from the surface of the N type epitaxial layer 2' (FIG. 3).

A second lightly doped N type layer 2" is then epitaxially grown over the first lightly doped N type epitaxial layer 2' and the P type buried region 12. The dopant concentration of the second lightly doped layer 2" can be different from the dopant concentration of the first lightly doped layer 2', even if of the same order of magnitude. After this step, the P type region 12 is buried under the second lightly doped N type layer 2".

Figure 4:
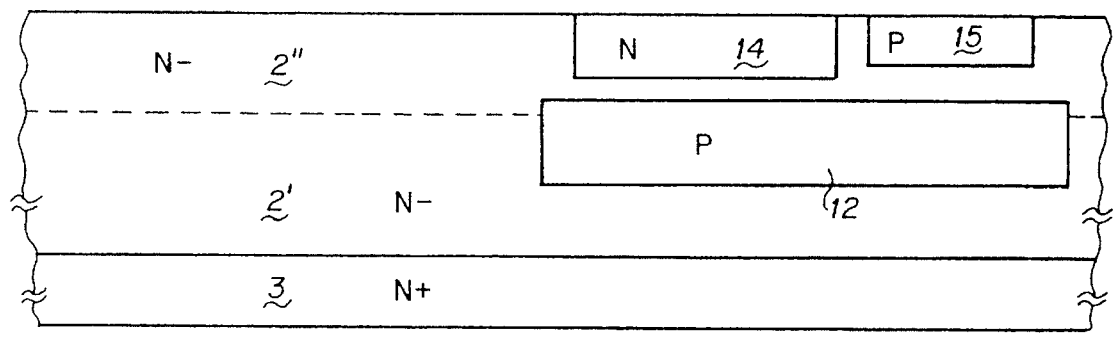

N type and P type dopants are then selectively introduced into the second lightly doped N type layer 2" to form N type and P type wells 14 and 15 over the P type buried region 12 (FIG. 4). As already mentioned, if the doping level of the second lightly doped N type layer 2" is adequate, there is no need to introduce other dopants in the region where the P-channel MOSFETs will be integrated.

Figure 5:
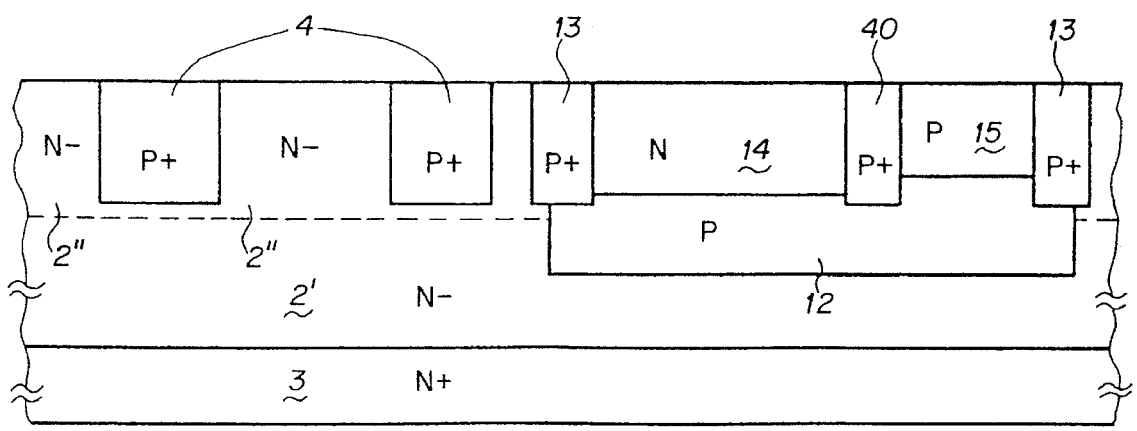

A high dose of P type dopant is selectively introduced into the second lightly doped N type layer 2" to form the P+ deep body regions 4 of the elementary cells 1, and the P+ regions 13 and 40 which, together with the P type buried region 12, define isolated portions of the second lightly doped N type layer 2", and which provide electrical contact to the P type buried region 12 (FIG. 5). In a preferred embodiment, the P+ regions 13 and 40 are defined together with the P+ deep body regions 4, simply by proper layout of a litographic mask. This can be performed by growing an oxide layer over the surface of the second lightly doped N type layer 2", selectively removing the oxide layer, and implanting and diffusing a P type dopant into the second lightly doped N type layer 2". After these steps, at least one isolated portion of the second lightly doped N type layer 2" is completely surrounded and isolated from the bulk of the second N type layer 2".

After the definition of active areas on the second lightly doped N type layer 2" surface (separated each other by a thick field oxide layer 26), a thin gate oxide layer 8 is grown on them. A polysilicon gate layer is then deposited over the thin gate oxide layer 8, and the field oxide layer 26.

The polysilicon gate layer is then selectively removed to form the gates 7, 19 and 20 of the elementary cells 1, and of the N-channel and P-channel MOSFETs of the driving and contol circuitry.

Figure 6:
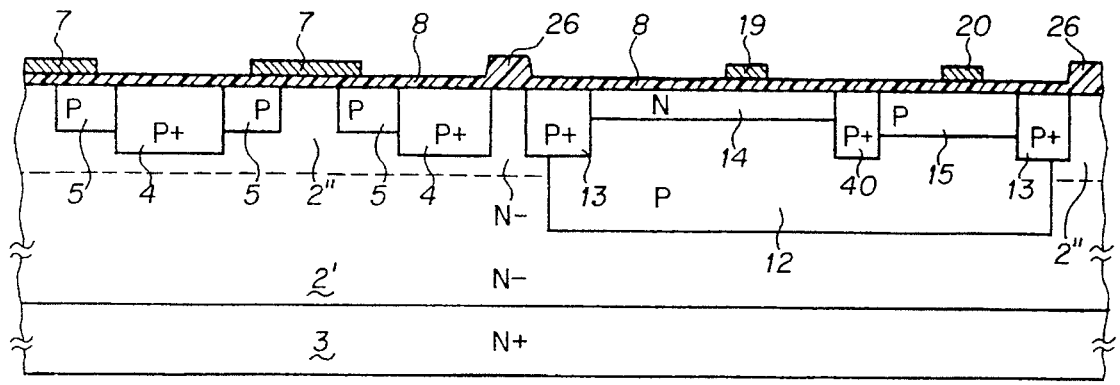

A low dose of a P type dopant is selectively introduced into the second lightly doped N type layer 2" to form the channel regions 5 of the elementary cells 1 (FIG. 6).

Figure 7:
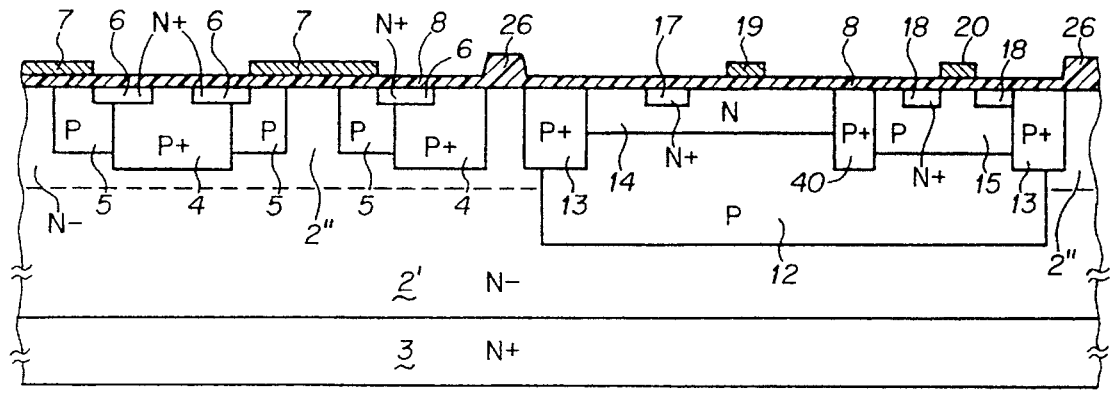

A high dose of an N type dopant is then selectively introduced into the P+ deep body regions 4 and the P type body regions 5 to form source regions 6 of the elementary cells 1. Said N type dopant is simultaneously introduced into the P type well 15 to form N+ source and drain self-aligned regions 18 of the N-channel MOSFET, and into the N type well 14 to form the N+ contact region 17 (FIG. 7).

Figure 8:
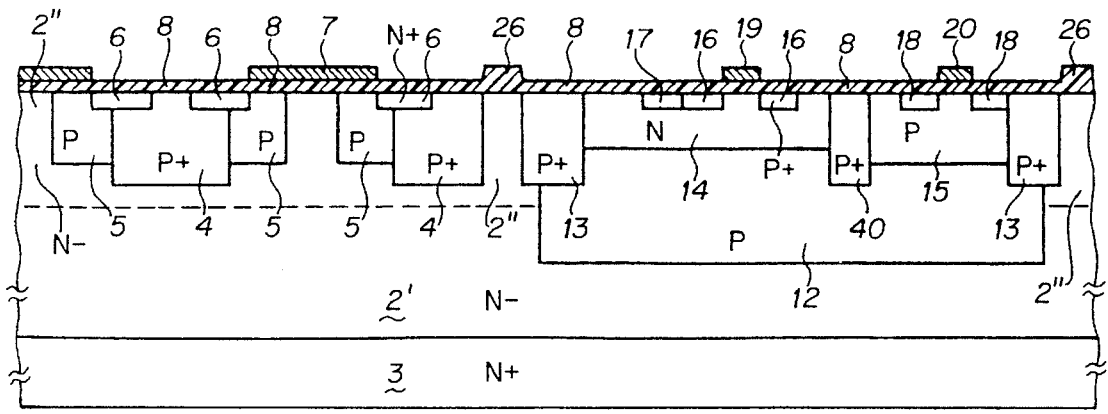

A high dose of a P type dopant is then selectively introduced into the N type wells 14 to form P+ source and drain self-aligned regions 16 of the P-channel MOSFET (FIG. 8).

A passivation layer 9 (such as Phosphorous doped Silicon Glass) is then deposited, through which contact areas to the N+ source regions 6 and P+ deep body regions 4 of the elementary cells 1, to the P+ region 13, to the source and drain regions 16 and 18 of the P-channel and N-channel MOSFETs, and to the N+ contact region 17 of the N type well 14 are defined. A metal layer is deposited and selectively etched to form the desired pattern of interconnections 10, 21–24. A passivating material (such as glass), not shown, is finally deposited over the metal layer. The bottom surface of the substrate 3 is covered with a metal layer 11 to provide an electrical contact to the drain region of the VDMOSFET.

As it clearly appears to those skilled in the art, the described sequence of steps can be altered without departing from the scope of the present invention; for example, the P+ deep body regions 4 of the elementary cells 1, and the P+ regions 13 and 40 delimiting the isolated portion of the second lightly doped N type layer 2", can be defined before the P type and N type wells.

The P type well 15 can be driven in deeper than the P+ deep body regions 4 and the P+ regions 13 and 40, to ensure electrical continuity with the P type buried region 12, and to reduce their surface concentration.

Another manufacturing process suitable to provide the PIC structure of FIG. 1, starts with the epitaxial growth of a lightly doped N type layer 2 over the heavily doped N type substrate 3.

Figure 9:
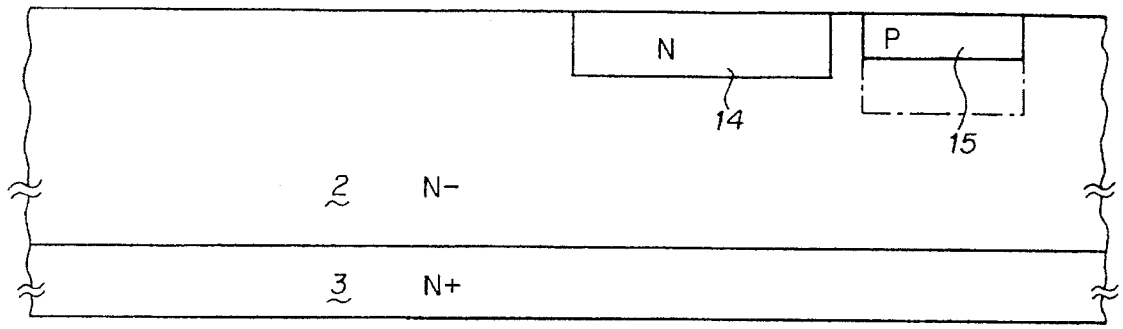
FIGS. 9 to 11 are cross-sectional views of the PIC structure of FIG. 1, showing intermediate steps of another manufacturing process according to the present invention.

N type and P type dopants are then selectively introduced into the lightly doped N type layer 2 to form N type and P type wells 14 and 15 where the P-channel and N-channel MOSFETs will be defined (FIG. 9).

Figure 10:
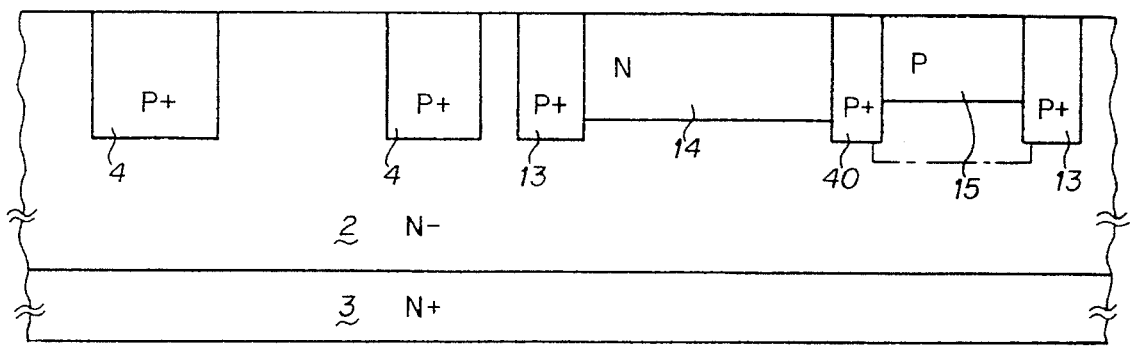

A high dose of a P type dopant is then selectively introduced into the lightly doped N type layer 2 to form the P+ deep body regions 4 of the elementary cells 1, and the P+ regions 13 and 40 (FIG. 10). As for the previous manufacturing process, the P+ regions 13 and 40 are preferably defined together with the P+ deep body regions 4.

A P type dopant is then selectively introduced into the lightly doped N type layer 2 with a high energy implantation technique, so that the resulting doping profile has a peak located some microns under the surface of the N type layer 2, and the surface concentration is lower than that of the N type layer 2. P type buried regions 12 can thus be obtained which, together with the P+ regions 13 and 40, define a portion of the lightly doped N type layer 2 completely isolated from the bulk of the lightly doped N type layer 2 (FIG. 11).

From this point on, the process continues with the same steps of the previously described manufacturing process.

Figure 11:
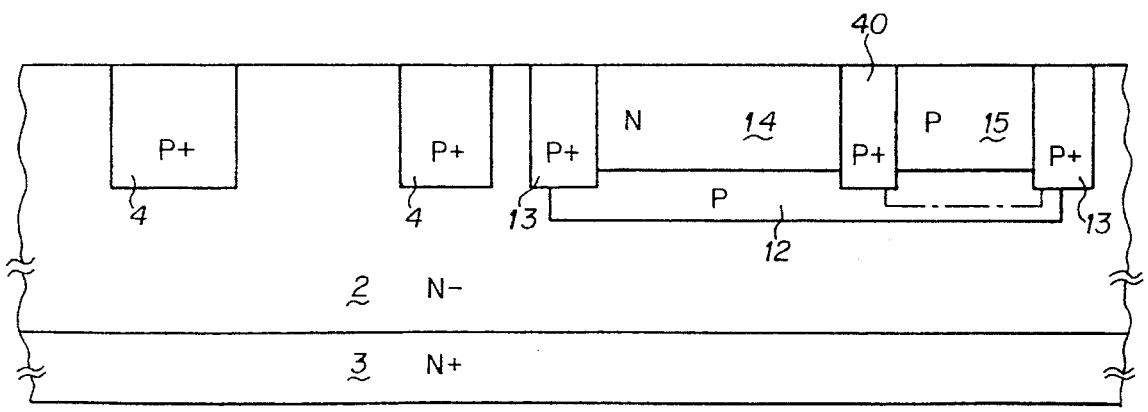

In this case also, the P type well 15 can be driven in deeper than the P+ deep body regions 4 and the P+ regions 13 and 40, as shown in dash-dot line in FIGS. 9–11.

The present invention applies to PIC structures with VDMOSFET or vertical bipolar junction transistor power stage, or both. It is in fact known that a power BJT can be obtained with exactly the same process steps used to fabricate a VDMOSFET: the N type layer 2 forms the collector region, the P body region 5 forms a base region, and the N+ source region 6 forms an emitter region. P+ deep body regions 4 are provided under the contacts to the base region.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A process for manufacturing a PIC structure comprising a power stage and a driving and control circuit comprising first conductivity type-channel MOSFETs and second conductivity type-channel MOSFETs, the process comprising the steps of:

a) forming at least one buried region of a second conductivity type within a lightly doped semiconductor layer of a first conductivity type superimposed over a heavily doped semiconductor substrate of the first conductivity type constituting a first electrode of the power stage;

b) selectively introducing a dopant of the second conductivity type into the lightly doped semiconductor layer to form at least one well region of the second conductivity type;

c) selectively introducing a high dose of a dopant of the second conductivity type into the lightly doped semiconductor layer to simultaneously form heavily doped deep body regions for the power stage, at least one heavily doped annular region defining, with a respective buried region, a lightly doped isolated region of the first conductivity type isolated from the lightly doped semiconductor layer and containing at least one well region of the second conductivity type, and heavily doped regions at the sides of said at least one well region;

d) forming a gate oxide layer over the lightly doped semiconductor layer;

e) forming a polysilicon layer over the gate oxide layer;

f) selectively removing the polysilicon layer to form insulated gate regions for the MOSFETs of the driving and control circuit;

g) selectively introducing a dopant of the second conductivity type into the lightly doped semiconductor layer to form body regions of the second conductivity type for the power stage;

h) selectively introducing a high dose of a dopant of the first conductivity type into the body regions to form a heavily doped second electrode of the power stage, and into the well region, at the sides of the insulated gate regions, and the lightly doped isolated region to respectively form source and drain regions for the first conductivity type-channel MOSFETs of the driving and control circuitry, and to form a contact region to the lightly doped isolated region;

i) selectively introducing a high dose of a dopant of the second conductivity type into the lightly doped isolated region at the sides of the insulated gate regions to form heavily doped source and drain regions for the second conductivity type-channel MOSFETs of the driving and control circuitry.

2. The manufacturing process according to claim 1, wherein step b) also provides for the selective introduction of a dopant of the first conductivity type into the lightly doped semiconductor layer to form at least one well region of the first conductivity type having a dopant concentration higher than that of the lightly doped semiconductor layer and wherein the second conductivity type-channel MOSFETs of the driving and control circuitry are to be integrated.

3. The manufacturing process according to claim 1, wherein step b) also provides for the selective introduction of a dopant of the second conductivity type into the lightly doped semiconductor layer to form at least one well region of the first conductivity having a dopant concentration lower than that of the lightly doped semiconductor layer and wherein the second conductivity type-channel MOSFETs of the driving and control circuitry are to be integrated.

4. The manufacturing process according to claim 1, wherein step a) further includes the steps of:

a1) forming a first lightly doped semiconductor layer of the first conductivity type over the heavily doped semiconductor substrate;

a2) selectively introducing a dopant of the second conductivity type into the first lightly doped semiconductor layer to form at least one region of the second conductivity type;

a3) forming a second lightly doped semiconductor layer of the first conductivity type over the first lightly doped semiconductor layer and over said at least one region of the second conductivity type.

5. The manufacturing process according to claim 4, wherein step b) is performed after step c) and before step d).

6. The manufacturing process according to claim 4, wherein said first lightly doped semiconductor layer and said second lightly doped semiconductor layer are epitaxial layers.

7. The manufacturing process according to claim 4, wherein said first lightly doped semiconductor layer and said second lightly doped semiconductor layer have the same resistivity.

8. The manufacturing process according to claim 4, wherein said first lightly doped semiconductor layer and said second lightly doped semiconductor layer have different resistivities.

9. The manufacturing process according to claim 1, wherein step a) further includes the steps of:

a1) forming a lightly doped semiconductor layer of the first conductivity type over the heavily doped semiconductor substrate;

a2) selectively implanting at high energy a dopant of the second conductivity type into the lightly doped semiconductor layer to form said at least one buried region of the second conductivity type.

10. The manufacturing process according to claim 9, wherein step a2) is performed after step c) and before step d).

11. The manufacturing process according to claim 9, wherein said lightly doped semiconductor layer an epitaxial layer.

12. The manufacturing process according to claim 11, wherein the power stage is a Vertical Double-diffused MOSFET, and wherein step f) also provides for simultaneously forming insulated gate regions for the Vertical Double-diffused MOSFET.

13. A method of manufacturing a power stage and a driving and control stage, comprising the steps of:

(A) forming a first heavily doped layer having a first conductivity type;

(B) forming a second lightly doped layer having a first conductivity type, over the first heavily doped layer;

(C) forming a buried region of a second conductivity type in the second lightly doped layer;

(D) introducing a dopant of the second conductivity type in the second lightly doped layer, to form a well region in the second lightly doped layer; and (E) introducing a dopant of the second conductivity type in a plurality of locations to form heavily doped regions which define along with the buried region, a first region of the first conductivity type bordered by the heavily doped regions and the buried region, and the well region bordered by the heavily doped regions and the buried region.

14. The method of claim 13, further comprising the step of introducing a dopant of the first conductivity type in the second lightly doped layer to form a well which forms the first region.

* * * * *

UNITED STATES PATENT AND TRADEMARK OFFICE
CERTIFICATE OF CORRECTION

PATENT NO. : 5,591,662
DATED : January 7, 1997
INVENTOR(S): Raffaele Zambrano

It is certified that error appears in the above-identified patent and that said Letters Patent is hereby corrected as shown below:

On the title page item [73] should read:

[73]  Consorzio per la Ricerca sulla Microelettronica nel Mezzogiorno, Catania, Italy Signed and Sealed this Seventh Day of April, 1998

Attest:

BRUCE LEHMAN

Attesting Officer

Commissioner of Patents and Trademarks